United States Patent [19]

Gibson et al.

[11] Patent Number: 5,049,881

[45] Date of Patent: Sep. 17, 1991

[54] APPARATUS AND METHOD FOR VERY HIGH DATA RATE-COMPRESSION INCORPORATING LOSSLESS DATA COMPRESSION AND EXPANSION UTILIZING A HASHING TECHNIQUE

[75] Inventors: Dean K. Gibson, Harbor City; Mark D. Graybill, Agoura Hills, both of Calif.

[73] Assignee: Intersecting Concepts, Inc., Agoura Hills, Calif.

[21] Appl. No.: 539,880

[22] Filed: Jun. 18, 1990

[51] Int. Cl.$^5$ ............................................. H03M 7/30
[52] U.S. Cl. .................................. 341/95; 341/51; 341/55
[58] Field of Search ....................... 341/51, 55, 60, 79, 341/81, 87, 65, 67, 95, 107; 364/200, 260.6, 900, 951.3; 383/56; 358/261.2

[56] References Cited

U.S. PATENT DOCUMENTS

| | | |
|---|---|---|
| 3,914,586 | 9/1975 | McIntosh . |
| 4,087,788 | 5/1978 | Johannesson . |
| 4,464,650 | 8/1984 | Eastman et al. . |
| 4,558,302 | 6/1985 | Welch . |
| 4,560,976 | 9/1985 | Finn . |
| 4,586,027 | 4/1986 | Tsukiyama et al. . |
| 4,677,649 | 6/1987 | Kunishi et al. . |
| 4,682,150 | 7/1987 | Mathes et al. . |
| 4,758,899 | 7/1988 | Tsukiyama . |
| 4,809,350 | 2/1989 | Shimoni et al. . |
| 4,814,746 | 3/1989 | Miller et al. ........................ 341/95 |
| 4,853,696 | 8/1989 | Mukherjee ........................... 341/65 |
| 4,872,009 | 9/1989 | Tsukiyama et al. . |
| 4,906,991 | 3/1990 | Fiala et al. ........................... 341/51 |

Primary Examiner—A. D. Pellinen
Assistant Examiner—Brian K. Young
Attorney, Agent, or Firm—Thomas I. Rozsa

[57] ABSTRACT

A method and apparatus for compressing digital data that is represented as a sequence of characters drawn from an alphabet. An input data block is processed into an output data block composed of sections of variable length. Unlike most prior art methods which emphasize the creation of a dictionary comprised of a tree with nodes or a set of strings, the present invention creates its own pointers from the sequence characters previously processed and emphasizes the highest priority on maximizing the data rate-compression factor product. The use of previously input data acting as the dictionary combined with the use of a hashing algorithm to find candidates for string matches and the absence of a traditional string matching table and associated search time allows the compressor to very quickly process the input data block. Therefore, the result is a high data rate-compression factor product achieved due to the absence of any string storage table and matches being tested only against one string.

15 Claims, 7 Drawing Sheets

APPARATUS AND METHOD FOR VERY HIGH DATA RATE-COMPRESSION INCORPORATING LOSSLESS DATA COMPRESSION AND EXPANSION UTILIZING A HASHING TECHNIQUE

BACKGROUND OF THE INVENTION

1. Field of the Invention

The present invention relates to an apparatus and method for processing data signals wherein the data signals are compressed and subsequently reconstituted. Data compression involves the process of transforming a body of data to a typically smaller representation from which the original can be computed at a later time. The field of the present invention further relates to lossless data compression, wherein data that is compressed and then subsequently decompressed must always be identical to the original. The field of the present invention further relates to compression of digital data which is data that is represented as a sequence of characters drawn from some alphabet.

2. Description of the Prior Art

Several methods and apparatus for performing said methods are known in the prior art to compress data signals and subsequently reconstitute them. An alphabet is a finite set containing at least one element. The elements of an alphabet are called characters. A string over an alphabet is a sequence of characters, each of which is an element of that alphabet. A common approach to compressing a string of characters is textual substitution. A textual substitution data compression method is any compression method that compresses text by identifying repeated substrings and replacing some substrings by references to other copies. Such a reference is commonly known as a pointer and the string to which the pointer refers is called a target. Therefore, in general, the input to a data compression algorithm employing textual substitution is a sequence of characters over some alphabet and the output is a sequence of characters from the alphabet interspersed with pointers. The following patents are representative known prior art compression methods and apparatus:

1. U.S. Pat. No. 4,464,650 issued to Eastman et al on Aug. 7, 1984 for "Apparatus And Method For Compressing Data Signals And Restoring The Compressed Data Signals".

2. U.S. Pat. No. 4,558,302 issued to Welch on Dec. 10, 1985 for "High Speed Data Compression And Decompression Apparatus And Method".

3. U.S. Pat. No. 4,586,027 issued to Tsykiyama et al. on Apr. 29, 1986 for "Method And System For Data Compression And Restoration".

4. U.S. Pat. No. 4,560,976 issued to Finn on Dec. 24, 1985 for "Data Compression".

5. U.S. Pat. No. 3,914,586 issued to McIntosh on Oct. 21, 1975 for "Data Compression Method And Apparatus".

6. U.S. Pat. No. 4,682,150 issued to Mathes et al. on July 21, 1987 for "Data Compression Method And Apparatus".

7. U.S. Pat. No. 4,872,009 issued to Tsukiyama et al. on Oct. 3, 1989 for "Method And Apparatus For Data Compression And Restoration".

8. U.S. Pat. No. 4,758,899 issued to Tsukiyama on July 19, 1988 for "Data Compression Control Device".

9. U.S. Pat. No. 4,809,350 issued to Shimoni et al. on Feb. 28, 1989 for "Data Compression System".

10. U.S. Pat. No. 4,087,788 issued to Johannesson on May 2, 1978 for "Data Compression System".

11. U.S. Pat. No. 4,677,649 issued to Kunishi et al. on June 30, 1987 for "Data Receiving Apparatus".

In general, as illustrated by the above patents, data compression systems are known in the prior art that encode a stream of digital data signals into compressed digital code signals and decode the compressed digital code signals back into the original data. Various data compression systems are known in the art which utilize special purpose compression methods designed for compressing special classes of data. The major drawback to such systems is that they only work well with the special class of data for which they were designed and are very inefficient when used with other types of data. The following compression systems are considered general purpose.

The best known and most widely used general purpose data compression procedure is the Huffman method. The Huffman procedure maps fixed length segments of symbols into variable length words. The Huffman procedure involves calculating probabilities of the occurrences of certain symbols and establishing a tree having leaves for symbols with certain probabilities and new nodes established from lower probability symbols which nodes are also placed on the tree. The Huffman data compression procedures have many limitations. Huffman encoding requires prior knowledge of the statistical characteristics of the source data. This is cumbersome and requires considerable working memory space. In addition, Huffman requires intensive calculations for variable bit compression. Also, Huffman requires a dictionary in the output stream for reconstruction of the digital signal or requires a prior knowledge of the dictionary which limits the applicability to specific types of data.

A second well known compression technique is the Tunstall algorithm which maps variable length segments of symbols into fixed length binary words. Tunstall also has many of the disadvantages of the Huffman method and further has the constraint that the output string consists of fixed-length binary words.

The third well known compression technique is the Lempel-Ziv method. One such method maps variable-length segments of symbols into various length binary words. A problem with this method is that the required memory space grows at a non-linear rate with respect to the input data. An improved variation of the Lempel-Ziv method is disclosed and claimed in Eastman U.S. Pat. No. 4,464,650. This new method has several major disadvantages. First, the method requires the creation of a searchtree database and therefore requires storage room for the dictionary. Second, the amount of achievable compression is heavily dependent on the dictionary. Third, management and searching of the dictionary is time consuming, yielding low data rate-compression factor product. Fourth, the growth characteristics of the dictionary requires $N-1$ input data string occurrences of string of length N in order to establish string in the dictionary. This results in reduced compression efficiency. Fifth, in the worst case, the growth of output data block is tied directly to the size of the dictionary. Making the dictionary larger can improve overall compression for compressible data, but yield larger percentage growths for incompressible data because more bits are required to represent fixed length dictionary pointers. Finally, the dictionary must be reconstructed during expansion, resulting in a slower reconstitution rate and more required memory space.

U.S. Pat. No. 4,558,302 issued to Welch is very similar to the Lempel-Ziv method described in U.S. Pat. No. 4,464,650 and also includes all of the basic problems of that method. The basic difference is that instead of storing the dictionary in a tree node type structure, Welch is explicitly compressing an input stream of data character signals by storing in a string table strings of data character signals encountered in the input streams. This has the additional disadvantage of requiring more storage than the Lempel-Ziv method. While it does provide the advantage of being faster if the number of strings that must be searched is small; it still has the poor dictionary growth characteristics of Lempel-Ziv.

The remaining patents which discuss compression algorithms include in the process the requirement of creating a dictionary, either in the form of a tree or a series of strings or similar arrangement which requires substantial memory and storage for the dictionary or the strings and the time consuming process of searching the dictionary, yielding a low data rate-compression factor product. Therefore, there is a significant need for an improved apparatus and method for compressing data which eliminates all of the problems discussed above and provides a faster and more efficient method of compressing the data while at the same time retaining most of the advantages of prior systems.

SUMMARY OF THE PRESENT INVENTION

The present invention relates to a method and apparatus for compressing digital data that is represented as a sequence of characters drawn from an alphabet. As with other compression methods, the present invention processes an input data block into an output data block composed of sections of variable length. Unlike most prior art methods which emphasize the creation of a dictionary comprised of a tree with nodes or a set of strings, the present invention creates its own pointers from the sequence of characters previously processed and emphasizes the highest priority on maximizing the data rate-compression factor product.

Data compression is not only used to save data storage space, but also to increase the effective data transfer rate of a mass storage device (like a hard disk) or a modem. As modern technology improves the data transfer rates of such hardware, this places higher demands on the data rate-compression factor product of the data compression system in order to yield performance improvements. It has been discovered that when a premium is placed on maximum compression with the data rate being secondary, that the data compression system quickly becomes the limiting factor in the maximum data rate that can be achieved. Therefore, the best utilization of high-performance hardware is obtained when the data rate is given priority over the amount of compression.

It has further been discovered, according to the present invention, that the use of previously input data acting as the dictionary combined with the use of a hashing algorithm to find candidates for string matches and the absence of a traditional string matching table and associated search time allows the compressor to very quickly process the input data block. Therefore, the result is a high data rate-compression factor product achieved in part due to the absence of any string storage table. In the highest performance embodiment, each candidate for a string match is tested only against one string. However, the present invention also includes embodiments where each candidate for a string match is tested against a small number of strings.

It has additionally been discovered, according to the present invention, that the use of previously input data acting as the dictionary combined with the use of a hashing algorithm to find candidates for string matches and the absence of a created dictionary eliminates the dictionary buildup slowness associated with prior art methods because the present invention method can match on a string up to the maximum count value in the identifier header upon the second occurrence of the string in the input data. As a result there is an increased probability of long string matches. In prior art dictionary matching techniques, there is a requirement of N−1 occurrences of a string in the input data for the string of length N to be completely entered in the dictionary. By elimination of this technique, the present method results in an increased probability of long string matches.

It has further been discovered, according to the present invention, that the creation of increased probability of long string matches by matching on a string up to the maximum count value in the identifier header upon the second occurrence of the string in the input data achieves the result that a long string of repeated characters will be reduced to two output sections. The first output section will have an identification header indicating a count of one byte of incompressible data, followed by a second output section that has an identification header containing count N−1, where N is the length of the repeated character string, and pointing backwards to the first byte of the repeated character string. This results in very efficient handling and matching of repeated character strings. Therefore, through this process, the present invention eliminates the need for pre-processing with run length encoding.

It has also been discovered, according to the present invention, that the compression technique of the present invention results in a very high performance expansion of the compression data back to the original form with a lossless result. This is created because the expansion method only has to perform the following basic steps:

A. Evaluate identification header for count and uncompressed information;

B. Compute copy pointer;

C. Copy count bytes from the copy pointer to destination;

D. Increment source and destination pointers appropriately; and

E. Repeat steps A-D for each section.

It has further been discovered, according to the present invention, that the expansion method is unaffected by changes to the compression hashing algorithm. Since the expansion method does not perform hashing, or have to recreate a dictionary to decode the encoded data, it is insensitive to changes in the compression hashing algorithm. Thus changes to the hashing algorithm could be made according to available processing power, and appropriate compression factor gains realized, without affecting data expansion.

It has additionally been discovered, according to the present invention that the result of a high probability of long string matches means that the system does not have to examine a great deal of input data to have an efficient matching system. Smaller blocks of data can be processed at a time without significantly degrading compression performance.

Through use of the present method, it has been further discovered that good compression ratios can be achieved from small data blocks. The present method requires only two occurrences of a string to provide a match which results in high compression efficiency with small amounts of input data. Requiring only two occurrences of string to provide excellent matching combined with the limited worst case growth characteristics of the compression enables the present invention system to achieve excellent compression factor results with input data blocks as small as 50 bytes. This is substantially more efficient than the prior art methods which suffer from dictionary buildup problems which yield inefficient matching or the need to output the dictionary with the compressed data for reconstruction.

It has additionally been discovered, according to the present invention, that since the compressor copies incompressible data to the output block unchanged, except for the addition of the identifier header every maxcount bytes, the result is an extremely low worst case output block growth. For example, if 7 equals the number of bits used to represent the maxcount and 8 equals the number of bits used in the identifier header, then the worst case growth occurs when not a single repeated string of length greater than or equal to the input data subblock length can be found. Under these circumstances, the output data subblock consists of repeated sections of length $((2^7 \times 8) + 8)$ bits. The additional length simply comes from the identification header being inserted every maxcount bytes. The size increase becomes one byte in every 128 or less than 1% growth.

It has also been discovered, according to the present invention, that the backwards offset pointers can be encoded with a variable number of bits, thereby yielding improved compression factors. Since the hashing algorithm always stores a pointer to the most recent occurrence of a string and since an encoded backwards pointer is actually expressed as a positive offset inferred in the backwards direction, the backwards distances to repeated strings can be quite small. The encoded backwards pointer offset can use a variable number of bits according to any one of a number of schemes in which smaller offsets are represented by a smaller number of bits in the output data block. Thus, the method benefits from the encoding aspects of variable bit width encoding without having the disadvantages of having to store the dictionary in the output data stream for reconstruction, and having to prescan the data during compression to gather statistics to create the dictionary. All other parameters being equal, the method will also generally outperform fixed length pointer approaches.

It has further been discovered, according to the present invention, that a good hashing algorithm produces a high probability of finding a match, even with reasonably small hash tables. Since the hash table contains references to the most recently encountered strings, the probability of attempting to match on the wrong string (a "hash collision") is reasonably low, even with small hash tables. Since the storage requirements for the compressor arise solely from the use of the hash table, the smaller hash table sizes require smaller work random access memory storage. Therefore, with the present invention hash tables of 4 kilobytes or less in size yield very impressive compression factors.

Therefore, it is a principal object of the present invention to achieve very significant compression factors in a minimal amount of time.

It is a further object of the present invention to create a maximal rate of compression method for compressing data which will be widely useful in many applications and with many systems. Accordingly, it is an object of the present invention to include the following characteristics:

A. The data input can be any random data and there is no assumption of a priori knowledge of input data content. For example, some specialized compression systems rely on preloading string tables with likely matches to maximize compression efficiency. A major problem with this approach is that these systems fail when the underlying assumption regarding the input data proves incorrect. The present invention does not preload any information but works with any random set of information as provided.

B. The present method provides lossless data compression. Therefore, data that is compressed and then subsequently decompressed must always be identical to the original.

C. The present method has a high "data rate-compression factor" product. That is, the rate at which both the compression and expansion methods process data multiplied by the compression factor (i.e. 1.5 to 1, 2 to 1, etc.) should yield a high number. This is a significant departure from prior art methods and apparatus which place a priority on achieving the highest compression factor with data rate being a secondary consideration.

D. The present method has low memory overhead requirements and the compression factor is not very sensitive to changes in the size of the memory workspace. This allows the present method to be implemented in a wide variety of applications without significantly affecting performance.

E. The present method does not have significant memory overhead requirement growth when the size of the input data block grows.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENT

Although specific embodiments of the invention will now be described with reference to the drawings, it should be understood that such embodiments are by way of example only and merely illustrative of but a small number of the many possible specific embodiments which can represent applications of the principles of the invention. Various changes and modifications obvious to one skilled in the art to which the invention pertains are deemed to be within the spirit, scope and contemplation of the invention as further defined in the appended claims.

Figure 1:
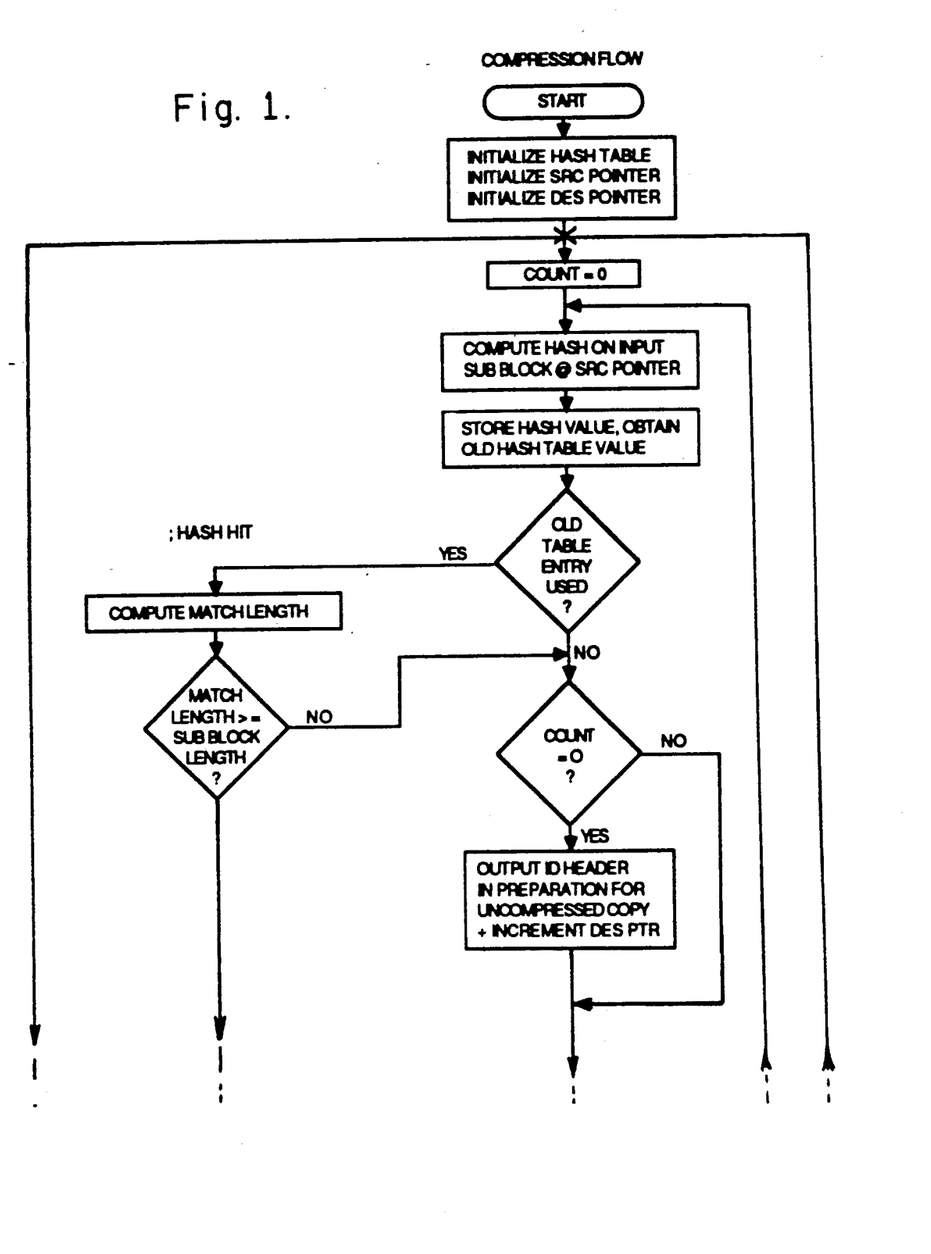
FIG. 1 is a flow chart of the compression method of the present invention.

Referring in particular to FIG. 1, the compression method for the present invention will be described first. At the beginning it is necessary to initialize or to set to a starting position or value four key elements. Hashing refers to a storage mechanism where data items are stored at locations that are determined by a mathematical function of the data. The use of hashing makes it possible to store and retrieve data items quickly, since it is not necessary to search through a list in order to find them. The first step is to initialize the hash table. Normally the hash table contains references to previously encountered strings. Since at the beginning there are no previous strings, each hash table entry is initialized with a special value to indicate that the entry in the hash table has not been previously used.

A pointer is a data item consisting of an address that tells where to find another data item. The source pointer, hereinafter referred to as the SRC pointer, points to uncompressed data during the compression stage. The Destination pointer, hereinafter referred to as the DES pointer, points to where you want the compressed data to be placed during the compression stage. The SRC pointer points to raw data. The DES pointer points to compressed data. These roles are reversed during the expansion stage. A back pointer is data in the compressed data stream. The Back pointer is a backwards offset to a previous occurrence of an identical string. The next three steps are to initialize the SRC pointer, and the DES pointer, and an uncompressed count value.

A fundamental concept of the present invention method is to match character strings comprising a minimum number of consecutive characters, for example 3 characters. This minimum number of characters is chosen so that the compressed data cannot be larger that the uncompressed data. This matching occurs for every subblock of three characters, without regard to any natural boundaries in the data (e.g., English words in the case of ASCII text). For each consecutive SRC pointer value, the three character subblock pointed to is hashed to an entry in the hash table. The previous contents of that entry are used as the location of a possible match, and the current SRC pointer value replaces that entry in the hash table.

The compressor then searches for redundant string information in the input data block by performing one or more hash calculations on input data subblocks. The minimum number of characters to match (and thus the size of the input data subblocks to hash) are chosen so that the compressed data cannot be larger than the uncompressed data, assuming worst case output encoding conditions. In the worst case, the output stream includes back pointers and identifier headers that are equal to the size of the input data subblocks they represent.

Therefore, referring to the flow chart in FIG. 1, the input data subblock is hashed, and a previous location for a possible match string is obtained from the hash table. If the value from the hash table indicates that this hash table entry has not been previously used, then a match has not occurred. Otherwise, the match length of the input data subblock to that previous string is computed. If that match length is less than the minimum number of characters to match then the data is considered incompressible data. If that match length is greater than or equal to the minimum number of characters to match, then the characters are compressed. In any case, the hash table is updated with the source pointer to the current input subblock. Updating the hash table is unconditional—it is not dependent on whether or not a match has occurred.

Each section of the output data block is preceded by an identifier header containing two pieces of information: (1) a count value, and (2) whether raw input data (i.e. incompressible data) follows the identifier header, or whether a backwards offset from the current position (i.e. a relative pointer to previous input data) follows the identifier header.

The compressor continues hash computations, incrementing the input data pointer and uncompressed byte count value, and storing the current input data pointer in the computed hash table location for future comparison. No output data is generated until either: (1) the uncompressed byte count value reaches the maximum count that the identifier header can support, or (2) a hash hit occurs, signaling the potential for a backwards pointer to be generated in the output data block as a result of comparing current input data to previous input data that is pointed to by the hash table entry, or (3) the input data block has been completely processed.

If the uncompressed byte count value reaches the maximum count that the identifier header can support, the output data block is sent an identifier header identifying the maximum count, and information indicating that incompressible data follows. The incompressible data is copied after each hash calculation, so the compressor only has to remember a pointer to the header identifier area that contains the count value. The incompressible data follows the identifier header.

If a hash hit occurs, a maximum length string match value is obtained by comparing the string at the current input data position and the previous matching input data position pointed to by the hash table value. If the computed match length is greater than or equal to the input data subblock length, an identifier header with appropriate backwards pointer information is encoded in the output block after encoding any incompressible data which was found between occurrences of a hash hit. If the computed match length is less than the input data subblock length (indicating a hash collision), the compressor proceeds as if no hash match had occurred. This encoding approach greatly reduces the worst case growth of the output data block when incompressible data appears in the input data block.

If the input data block has been completely processed and the count value is non-zero, an incompressible identification header is sent to the output data block along with the incompressible data before the method signals processing completion of the input data block.

Figure 3:
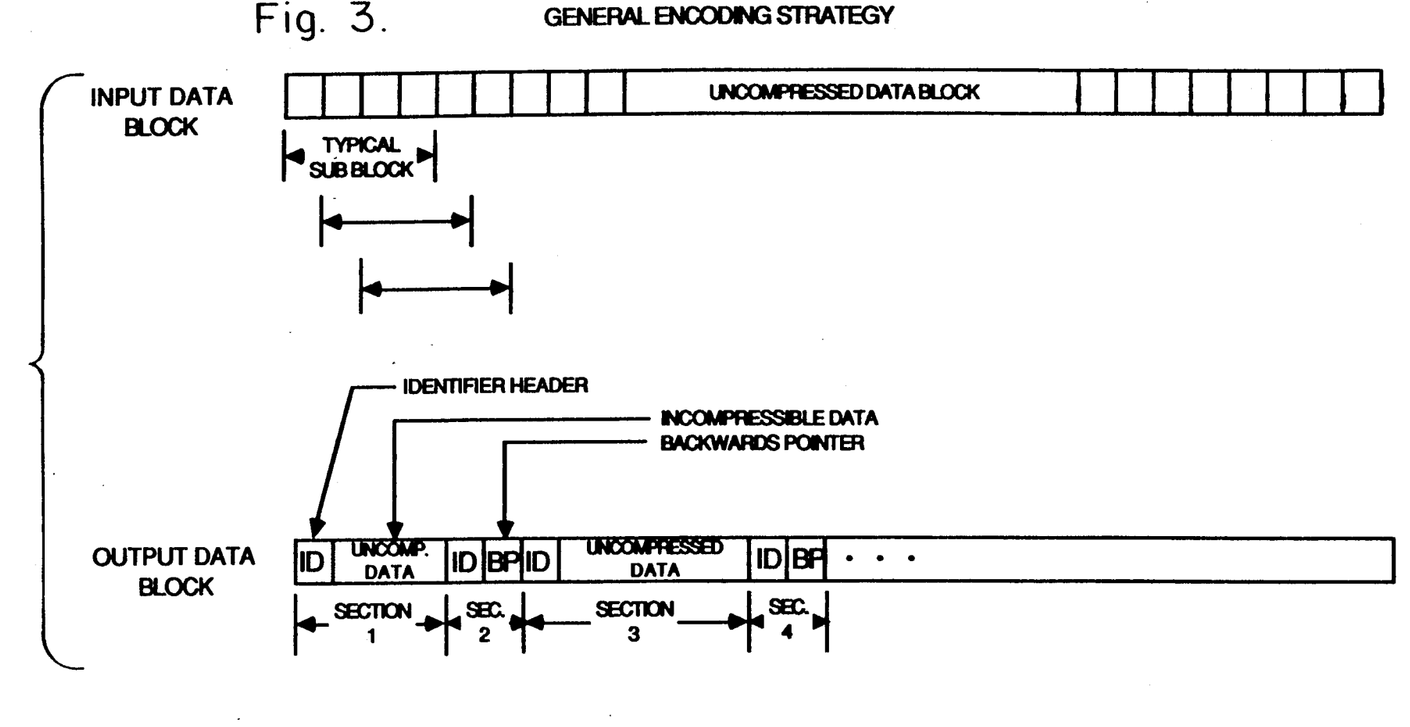
FIG. 3 is a block diagram of the general encoding strategy of the present invention method.

FIG. 3 diagrams the general format of the compressed output data. The compressed output data consists of variable length segments; each segment is either:

(1) an identification header signifying incompressible data, followed by a count and the incompressible data; or (2) an identification head signifying compressed data, followed by a count and a back pointer.

Figure 4:
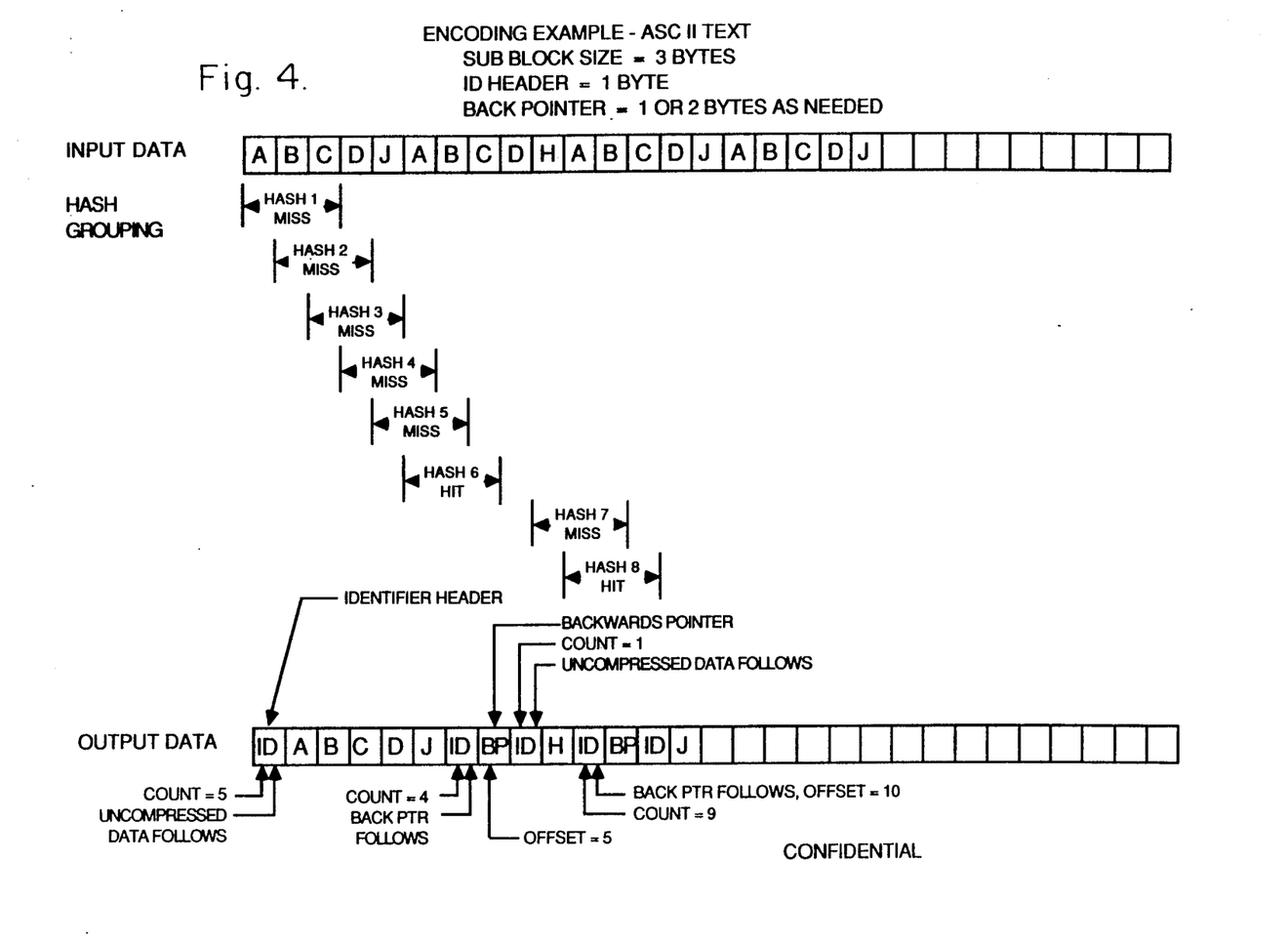
FIG. 4 is a block diagram of the encoding example -ASCII TEXT utilizing the present invention encoding strategy.
Figure 5:
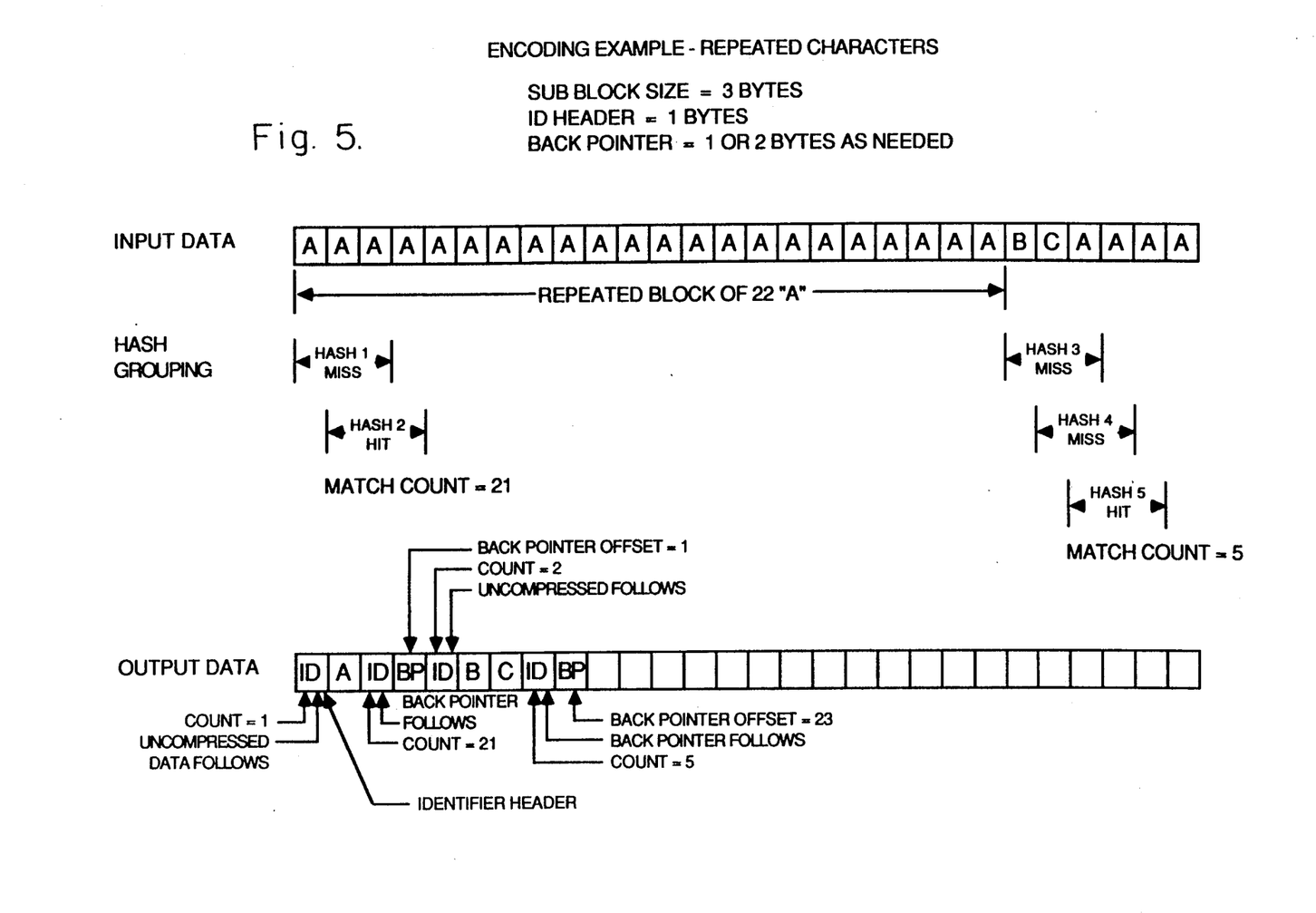
FIG. 5 is a block diagram of the encoding example - utilizing repeated characters incorporating the present invention encoding strategy.

This format is illustrated by the examples in FIGS. 4 and 5.

An encoding example using ASCII text is illustrated in FIG. 4. ASCII is a standard code for representing characters as binary numbers, used on most microcomputers, computer terminals, and printers. ASCII stands for American Standard Code for Information Interchange. In addition to printable characters, ASCII includes control characters. The subblock sizes used for hashing in this example comprises 3 bytes. (A bit is shorthand term for binary digit. There are only two possible binary digits, 0 and 1. A byte is the amount of memory space needed to store one character, which is normally 8 bits. A computer with 8-bit bytes can distinguish 256 different characters. One kilobyte equals 1,024 bytes.) The ID header comprises 1 byte. The back pointer comprises 1, or 2 bytes as needed. In the example, the input data block comprises the following input characters "ABCDJABCDHABCDJABCDJ". Beginning with the first character "A", the computer reads each group of 3 consecutive characters. The first time "ABC" appears, it is new and therefore incompressible data. Similarly, the first time for "BCD", "CDJ", "DJA", and "JAB" results in incompressible data. The second time the three characters "ABC" is encountered, there is a hash hit because of the comparison with the first series "ABC". Therefore, after the first identifier header, the five characters "ABCDJ" appears as incompressible data. Beginning with the next 4 count, after the next identifier header, a backwards pointer is encoded to compress the second appearance of the series "ABCD" and processing continues with the subblock "HAB". Continuing in order of subblocks of 3 characters, the computer comes across "HAB" which is new. When the computer comes across the next series of "ABC", it is once again a hash hit and a backwards pointer is created. The resulting match is on the string "ABCDJABCDJ"; for a match length of 9. However, the "H" separated hash hits and therefore an identifier header having a count of 1 for the "H" is encoded and the next identifier header is encoded with a count of 9 and a back pointer of 10. Finally, the last "J" is encoded with an identifier header with a count of 1.

Referring to FIG. 5, there is illustrated an encoding example for repeated characters. Once again, the subblock size is 3 bytes, the identifier header is 1 byte and the back pointer is 1 or 2 bytes as needed. There are 22 "A"s in a row followed by a "B", a "C" and then 5 "A"s in a row. The first hash computation on "AAA" is new and is therefore incompressible data. The second hash computation is also on "AAA", but one byte further in the source data block. This generates a hash hit with a match count of 21. The output is encoded with an identifier header having a count of 1 and the "A". After that, the "A" is repeated 21 more consecutive times. Therefore, a second identifier header having a count of 21 is encoded with a backwards pointer for the "A". Since both "B" and "C" are new, there is a third identifier header having a count of 2 and the "B" and "C" following. The next 5 "A"s are a repeated string so there is a fourth identifier header with a count of 5 and a backwards pointer.

By eliminating the dictionary, the matching is performed only through the previous data already in memory and therefore the matching is much faster since the computer does not have to search through a dictionary tree with leaves and nodes and also does not have to match through a series a strings. Instead, each time a unique subblock of at least 3 characters is encountered, it is initially an incompressible series but is hashed for a future match and thereafter when the same subblock of at least 3 characters is encountered, it is a hash hit and is likely to be encoded with an identifier header setting fourth the number of characters in the hash hit and a backwards pointer. A hash hit only constitutes a possibility for the match length to be met or exceeded.

Figure 2:
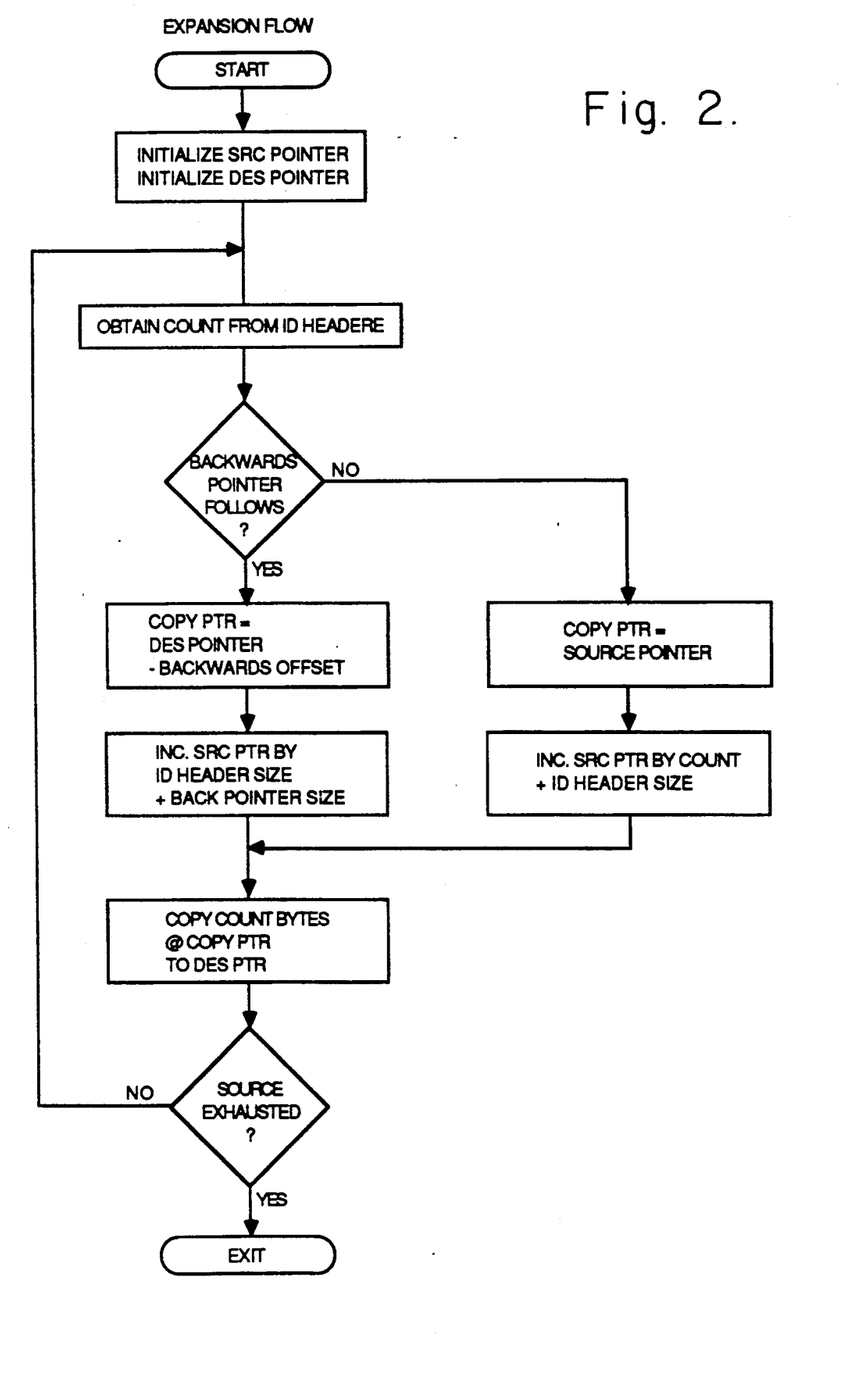
FIG. 2 is a flow chart of the expansion method of the present invention.

When the information is to be expanded back to its original form, the expansion algorithm of the present invention is utilized. The flow chart for the expansion algorithm is illustrated in FIG. 2. The first three steps are to initialize the SRC pointer, initialize the DES pointer and obtain the count from the ID header. The expansion algorithm is extremely simple and requires no hashing or any storage. The expander evaluates each section sequentially. Each section contains an identifier header specifying a count and whether the field following the header contains incompressible data or a backwards pointer. The expander computes a source pointer which either points to the incompressible data immediately following the identifier header, or points to previous data that has already been processed by the expander. It then copies data from the source pointer to the current destination pointer for the number of bytes designated by the count. Subsequent sections are processed identically.

Defining the present invention in detail, in a data compression method, having defined at least one variable length compression match output token which includes a count field containing a maximum count value and an incompressible data indicator field which together form an identification header, a backwards pointer to a previously encountered data field, and a size of backwards pointer field, having further defined at least one variable length incompressible data output token which consists of the identification header followed by incompressible data of length specified by the count field, and having further defined a subblock size of a minimum length for performing hash computations that cannot result in the compressed data being larger than the uncompressed data, a method for compressing input data into compressed output data, said compression method comprising the steps of:

a. initializing a hash table, a source pointer and a destination pointer;

b. initializing a count value and initializing and storing an identification header at the location of the destination pointer and then incrementing the destination pointer;

c. reading input subblocks pointed to by the source pointer, and computing hash values for the subblocks in the order in which they appear, and comparing the string located by the previous entry for this hash value to determine potential matches and unconditionally replacing the hash table entry with the current source pointer;

d. if a hash match does not occur, the data character pointed to by the source pointer is copied to the data area pointed to by the destination pointer, and the source pointer, destination pointer, and count value are incremented such that if the count value then is equal to the maximum count value, the maximum count value is stored in the current identification header and processing resumes with step b.;

e. if a hash match occurs, the match length of the data pointed to by the current hash table value and the data pointed to by the prior identical hash table value is determined;

f. if the match length so computed is less than the minimum match length, step d. is performed as if no hash value match had occurred;

g. if the match length so computed is equal to or greater than the minimum match length, the current identification header is updated with the count value to complete a prior packet of uncompressible data and an output match token is then stored at the location pointed to by the destination point consisting of a count field containing the match count, a raw data indicator field indicating that a backwards pointer follows, and a variable length backwards pointer that points to the most recent previous occurrence of the matching data and then the source pointer is incremented by the match count and the destination pointer is incremented by the output match size; and h. repeating steps b. through g. until the source data has been processed.

Therefore, the present invention may also be defined as a compression method for compressing a stream of input data into a compressed stream of output data based on a minimum number of characters in each input data subblock to be compressed, said compression method comprising the steps of:

a. initializing a hash table and initializing an SRC pointer;

b. processing input data in the order in which the characters in the data appear and hashing input data subblocks of the minimum compression size selected;

c. maintaining a hash table which contains at each entry, an SRC pointer which points to a previous subblock which hashed to this hash table entry, such that the possibility of any string of data previously occurring in the input block may be tested by hashing the current subblock to a hash table entry, obtaining the previous SRC pointer contained in that entry, and comparing the two strings of data;

d. if the two strings of data match on at least the size of the subblock, then generating a backwards pointer to the previous occurrence of the same string of data and thereby compressing the second occurrence of the string of data;

e. if the two strings of data do not match, then storing the string of data as incompressible data; and f. continuing steps b. through e. until the entire input data has been processed.

The backwards pointer is encoded with a variable number of bits and storing the backwards pointer to the most recent occurrence of a string, thereby creating a short backwards distance to repeated strings.

In addition, the present invention further comprises a method for expanding the stream of compressed data which has been compressed, back into the original stream of data, the expansion method comprising the steps of:

a. determining for each segment of the compressed input data, whether it comprises incompressible data or is a back pointer reference;

b. if the input data segment comprises incompressible data, copying the input data segment to the output data stream;

c. if the input data segment comprises a back pointer reference, computing the location of the previously expanded data referred to, and copying that previously expanded data to the output stream; and d. continuing steps a. through c. until the entire compressed input data has been processed.

Defined more broadly, the present invention is a compression method for compressing a stream of input data into a compressed stream of output data based on a minimum number of characters in each input data string to be compressed, said compression method comprising the creation of a hash table, hashing each occurrence of a string of input data and subsequently searching for identical strings of input data and if such an identical string of input data is located whose string size is at least equal to the minimum compression size selected, compressing the second and all subsequent occurrences of such identical string of data, if a string of data is located which does not match to a previously compressed string of data, storing such data as uncompressed data, and for each input string after each hash is used to find a possible previous match location for the string, the location of the string is stored in the hash table, thereby using the previously processed data to act as a compression dictionary.

The present invention further comprises a method for expanding the stream of compressed data which has been compressed in accordance with claim 4 back into the original stream of data, the expansion method comprising sequentially analyzing each string of compressed data and if the string contains incompressible data then duplication of the string, and if the string references previously expanded data then duplication of the previously expanded data and repeating the steps until the entire compressed input data stream has been expanded back to the original data.

Figure 6:
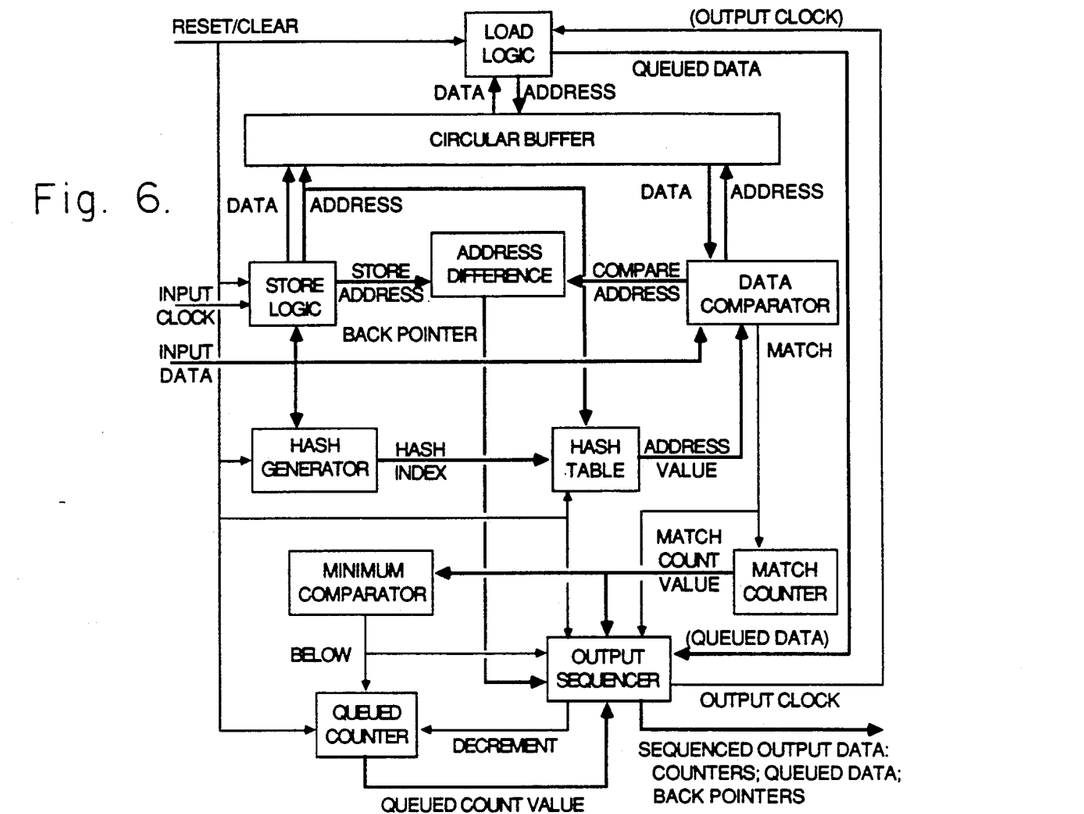
FIG. 6 is a block diagram of a compression apparatus used to perform the present invention compression method.

An example of the apparatus used to perform the present invention compression method is illustrated in FIG. 6. The store logic stores all input data into the circular buffer for subsequent reference. After each store, the internal address is incremented. The hash generator remembers the last several bytes (depending on the implementation subblock size) As each input data is received, the oldest byte is discarded, and a new hash index value is generated. The hash table retrieves the address value associated with the hash index, and replaces it with a new address from the store logic. The data comparator only latches the old address value if the result of the previous compare was not equal; otherwise, it increments the previous latched value. The data comparator increments the match counter whenver the compare is equal, and resets the match counter whenever the compare is not equal. The minimum comparator increments the queued counter whenever the match counter value is below the minimum value for generating a back pointer (typically 3). The output sequencer waits until either the queued counter reaches its maximum value, or until the minimum comparator shows a match counter value not below the minimum. At that point, the queued count value is output, and the queued data is obtained from the circular buffer through load logic. Then if the minimum comparator shows a match counter value not below the minimum, the output sequencer clocks the load logic (to keep its address in sync), and waits until either the match counter reaches its maximum value, or the data comparator shows no match, and then finally outputs the match counter and the back pointer from the address difference logic.

The following is an example utilizing the above compression apparatus. Assume that the input string is "ABCABCABCABCABCDEF". Before starting, the apparatus is reset with the "reset/clear" signal; this resets the output sequencer and clears the store logic and load logic internal address counters, the hash generator shift register, and marks address values in the hash table as unused (this forces the data comparator to miscompare). As the first five characters "ABCAB" are received, the characters are stored in the circular buffer, the queued counter is incremented, and hashes are generated on "ABC", "BCA", and "CAB" without a match. When the second "ABC" is read, however, the data comparitor reports a match. The output sequencer latches the back pointer value from the address difference logic, subtracts 2 (the minimum comparison value minus 1) from the queued counter value of 5 (giving 3) and then transfers 3 characters of queued data ("ABC") from the circular buffer. The data comparator continues to report a match until the match counter reaches 12 (occurrences 1-4 of "ABC" match occurrences 2-5 of "ABC"). At that point the output sequencer outputs and resets the match counter value of 12 and the back pointer value of 3. Subsequently, the string "DEF" does not match any previous string, and is output with a count of 3 in a similar manner to the first occurrence of "ABC".

Figure 7:
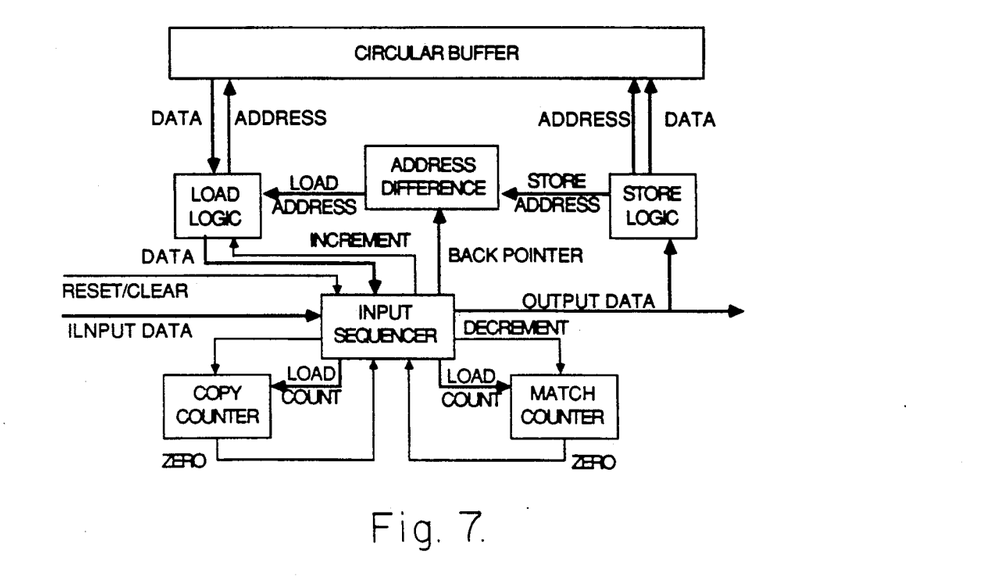
FIG. 7 block diagram of an expansion apparatus used to perform the present invention expansion method.

An expansion apparatus for the present invention method is illustrated in FIG. 7. The store logic stores all output data into the circular buffer for subsequent reference. After each store, the internal address is incremented. The input sequencer decodes the input stream. If a copy count is decoded, it is loaded into the copy counter and then decremented as subsequent input data is passed through as output data. If a match count is decoded, it is loaded into the copy counter and the associated back pointer is loaded into the address difference logic, then the copy counter is decremented as data from the circular buffer is obtained by the load logic and passed through as output data.

The following is an example utilizing the above expansion apparatus. Assume that the input string is "{id3}ABC{id12}{bp3}{id3}DEF" in this example (the result of compressing the string "ABCABCABCABCABCDEF" from the previous example). Before starting, the apparatus is reset with reset/clear signal; this resets the input sequencer (note that it is not necessary to clear the store logic and load logic internal address counters). When the first {id3} is decoded, the input sequencer loads the count value of 3 into the copy counter and copies the string "ABC" into the circular buffer as well as sending it as output data. When the {id12}{bp3} is decoded, the input sequencer loads the count value of 12 into the match counter, loads the back pointer value of 3 into the address difference logic (generating the correct load address value), and retrieves the 12 characters "ABCABCABCABC" from the circular buffer, which are copied back into the circular buffer (this creates the last 9 characters of this string in this example), as well as sending them as output data. When the second {id3} is decoded, the input sequencer again loads the count value of 3 into the copy counter and copies the string "DEF" into the circular buffer as well as sending it as output data.

Referring to the above described apparatus, the present invention may also be defined as the following apparatus.

A compression apparatus for compressing a stream of input data into a compressed stream of output data based on a minimum number of characters in each input data subblock to be compressed, said compression apparatus comprising:

a. means for initializing a hash table and means for initializing an SRC pointer;

b. means for processing input data in the order in which the characters in the data appear and means for hashing input data subblocks of the minimum compression size selected;

c. means for maintaining a hash table which contains at each entry, an SRC pointer which points to a previous subblock which hashed to this hash table entry, such that the possibility of any string of data previously occurring in the input block may be tested by hashing the current subblock to a hash table entry, means for obtaining the previous SRC pointer contained in that entry, and means for comparing the two strings of data;

d. if the two strings of data match on at least the size of the subblock, then means for generating a backwards pointer to the previous occurrence of the same string of data and thereby compressing the second occurrence of the string of data; and e. if the two strings of data do not match, then means for storing the string of data as incompressible data.

Means for expanding the stream of compressed data which has been compressed in accordance with claim 1 back into the original stream of data, the expansion means comprising:

a. means for determining for each segment of the compressed input data, whether it comprises incompressible data or is a back pointer reference;

b. if the input data segment comprises incompressible data, means for copying the input data segment to the output data stream; and c. if the input data segment comprises a back pointer reference, means for computing the location of the previously expanded data referred to, and copying that previously expanded data to the output stream.

A compression apparatus for compressing a stream of input data into a compressed stream of output data based on a minimum number of characters in each input data string to be compressed, said compression apparatus comprising the creation of a hash table, means for hashing each occurrence of a string of input data and subsequently searching for identical strings of input data and if such an identical string of input data is located whose string size is at least equal to the minimum compression size selected, means for compressing the second and all subsequent occurrences of such identical string of data, if a string of data is located which does not match to a previously compressed string of data, means for storing such data as uncompressed data, and for each input string after each hash is used to find a possible previous match location for the string, means for storing the location of the string in the hash table, thereby using the previously processed data to act as a compression dictionary.

An apparatus for expanding the stream of compressed data which has been compressed in accordance with claim 4 back into the original stream of data, the expansion apparatus comprising means for sequentially analyzing each string of compressed data and if the string contains incompressible data then means for duplication of the string, and if the string references previously expanded data then means for duplication of the previously expanded data.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms of modification in which the invention might be embodied or operated.

The invention has been described in considerable detail in order to comply with the patent laws by providing full public disclosure of at least one of its forms. However, such detailed description is not intended in any way to limit the broad features or principles of the invention, or the scope of patent monopoly to be granted.

What is claimed is:

1. A compression method for compressing a stream of input data into a compressed stream of output data based on a minimum number of characters in each input data subblock to be compressed, said compression method comprising the steps of:
    a. initializing a hash table and initializing an SRC pointer;
    b. processing input data in the order in which the characters in the data appear and hashing input data subblocks of the minimum compression size selected;
    c. maintaining a hash table which contains at each entry, an SRC pointer which points to a previous subblock which hashed to this hash table entry, such that the possibility of any string of data previously occurring in the input block may be tested by hashing the current subblock to a hash table entry, obtaining the previous SRC pointer contained in that entry, and comparing the two strings of data;
    d. if the two strings of data match on at least the size of the subblock, then generating a backwards pointer to the previous occurrence of the same string of data and thereby compressing the second occurrence of the string of data;
    e. if the two strings of data do not match, then storing the string of data as incompressible data; and
    f. continuing steps b. through e. until the entire input data has been processed.

2. The method in accordance with claim 1 wherein said backwards pointer is encoded with a variable number of bits and storing the backwards pointer to the most recent occurrence of a string, thereby creating a short backwards distance to repeated strings.

3. A method for expanding the stream of compressed data which has been compressed in accordance with claim 1 back into the original stream of data, the expansion method comprising the steps of:
    a. determining for each segment of the compressed input data, whether it comprises incompressible data or is a back pointer reference;
    b. if the input data segment comprises incompressible data, copying the input data segment to the output data stream;
    c. if the input data segment comprises a back pointer reference, computing the location of the previously expanded data referred to, and copying that previously expanded data to the output stream; and
    d. continuing steps a. through c. until the entire compressed input data has been processed.

4. A compression method for compressing a stream of input data into a compressed stream of output data based on a minimum number of characters in each input data string to be compressed, said compression method comprising the creation of a hash table, hashing each occurrence of a string of input data and subsequently searching for identical strings of input data and if such an identical string of input data is located whose string size is at least equal to the minimum compression size selected, compressing the second and all subsequent occurrences of such identical string of data, if a string of data is located which does not match to a previously compressed string of data, storing such data as uncompressed data, and for each input string after each hash is used to find a possible previous match location for the string, the location of the string is stored in the hash table, thereby using the previously processed data to act as a compression dictionary.

5. A method for expanding the stream of compressed data which has been compressed in accordance with claim 4 back into the original stream of data, the expansion method comprising sequentially analyzing each string of compressed data and if the string contains incompressible data then duplication of the string, and if the string references previously expanded data then duplication of the previously expanded data and repeating the steps until the entire compressed input data stream has been expanded back to the original data.

6. A compression method for compressing a stream of input data into a compressed stream of output data based on a minimum number of characters in each input data subblock to be compressed, said compression method comprising the steps of:
    a. creating an identifier header having a count value for data to follow and marking the identifier header with a code to designate whether incompressible or compressible data follows;
    b. reading input data in the order in which the input data appears and hashing subblocks and comparing them to previous subblocks with the same hash until a match to a previous subblock occurs which is a match on a string up to the maximum count value in the identifier header, and then generating a backwards pointer to designate the second occurrence of a character string equal to a previous identical string of characters of at least minimum match size and thereby compressing the second occurrence of the string; and
    c. continuing generating identifier headers and data until the entire input data stream has been processed.

7. The method in accordance with claim 6 wherein said backwards pointer is encoded with a variable number of bits and storing the backwards pointer to the most recent occurrence of a string, thereby creating a short backwards distance to repeated strings.

8. The method in accordance with claim 6 further comprising a method for expanding the stream of compressed data back into the original stream of data, the expansion method comprising the steps of:
    a. evaluating each section sequentially and determining if it contains incompressible data or a backwards pointer immediately following the identifier header;

b. if incompressible data is found, then the count value from the identifier header determines the amount of data to be copied from the input stream;

c. if a backwards pointer is found, then the count value from the identifier header determines the amount of data to be copied from the previously expanded data referred to by the backwards pointer; and d. repeating steps a. through c. until the entire compressed input stream has been expanded back to the original data.

9. In a data compression method, having defined at least one variable length compression match output token which includes a count field containing a maximum count value and an incompressible data indicator field which together form an identification header, a backwards pointer to a previously encountered data field, and a size of backwards pointer field, having further defined at least one variable length incompressible data output token which consists of the identification header followed by incompressible data of length specified by the count field, and having further defined a subblock size of a minimum length for performing hash computations that cannot result in the compressed data being larger than the uncompressed data, a method for compressing input data into compressed output data, said compression method comprising the steps of:

a. initializing a hash table, a source pointer and a destination pointer;

b. initializing a count value and initializing and storing an identification header at the location of the destination pointer and then incrementing the destination pointer;

c. reading input subblocks pointed to by the source pointer, and computing hash values for the subblocks in the order in which they appear, and comparing the string located by the previous entry for this hash value to determine potential matches and unconditionally replacing the hash table entry with the current source pointer;

d. if a hash match does not occur, the data character pointed to by the source pointer is copied to the data area pointed to by the destination pointer, and the source pointer, destination pointer, and count value are incremented such that if the count value then is equal to the maximum count value, the maximum count value is stored in the current identification header and processing resumes with step b.;

e. if a hash match occurs, the match length of the data pointed to by the current hash table value and the data pointed to by the prior identical hash table value is determined;

f. if the match length so computed is less than the minimum match length, step d. is performed as if no hash value match had occurred;

g. if the match length so computed is equal to or greater than the minimum match length, the current identification header is updated with the count value to complete a prior packet of uncompressible data and an output match token is then stored at the location pointed to by the destination point consisting of a count field containing the match count, a raw data indicator field indicating that a backwards pointer follows, and a variable length backwards pointer that points to the most recent previous occurrence of the matching data and then the source pointer is incremented by the match count and the destination pointer is incremented by the output match size; and h. repeating steps b. through g. until the source data has been processed.

10. A compression apparatus for compressing a stream of input data into a compressed stream of output data based on a minimum number of characters in each input data subblock to be compressed, said compression apparatus comprising:

a. means for initializing a hash table and means for initializing an SRC pointer;

b. means for processing input data in the order in which the characters in the data appear and means for hashing input data subblocks of the minimum compression size selected;

c. means for maintaining a hash table which contains at each entry, an SRC pointer which points to a previous subblock which hashed to this hash table entry, such that the possibility of any string of data previously occurring in the input block may be tested by hashing the current subblock to a hash table entry, means for obtaining the previous SRC pointer contained in that entry, and means for comparing the two strings of data;

d. if the two strings of data match on at least the size of the subblock, then means for generating a backwards pointer to the previous occurrence of the same string of data and thereby compressing the second occurrence of the string of data; and e. if the two strings of data do not match, then means for storing the string of data as incompressible data.

11. Means for expanding the stream of compressed data which has been compressed in accordance with claim 10 back into the original stream of data, the expansion means comprising:

a. means for determining for each segment of the compressed input data, whether it comprises incompressible data or is a back pointer reference;

b. if the input data segment comprises incompressible data, means for copying the input data segment to the output data stream; and c. if the input data segment comprises a back pointer reference, means for computing the location of the previously expanded data referred to, and copying that previously expanded data to the output stream.

12. A compression apparatus for compressing a stream of input data into a compressed stream of output data based on a minimum number of characters in each input data string to be compressed, said compression apparatus comprising the creation of a hash table, means for hashing each occurrence of a string of input data and subsequently searching for identical strings of input data and if such an identical string of input data is located whose string size is at least equal to the minimum compression size selected, means for compressing the second and all subsequent occurrences of such identical string of data, if a string of data is located which does not match to a previously compressed string of data, means for storing such data as uncompressed data, and for each input string after each hash is used to find a possible previous match location for the string, means for storing the location of the string in the hash table, thereby using the previously processed data to act as a compression dictionary.

13. An apparatus for expanding the stream of compressed data which has been compressed in accordance with claim 12 back into the original stream of data, the expansion apparatus comprising means for sequentially analyzing each string of compressed data and if the string contains incompressible data then means for duplication of the string, and if the string references previously expanded data then means for duplication of the previously expanded data.

14. A compression apparatus for compressing a stream of input data into a compressed stream of output data based on a minimum number of characters in each input data subblock to be compressed, said compression apparatus comprising:
   a. means for creating an identifier header having a count value for data to follow and means for marking the identifier header with a code to designate whether incompressible or compressible data follows; and
   b. means for reading input data in the order in which the input data appears and means for hashing subblocks and comparing them to previous subblocks with the same hash until a match to a previous subblock occurs which is a match on a string up to the maximum count value in the identifier header, and then means for generating a backwards pointer to designate the second occurrence of a character string equal to a previous identical string of characters of at least minimum match size and thereby compressing the second occurrence of the string.

15. The apparatus in accordance with claim 14 further comprising an apparatus for expanding the stream of compressed data back into the original stream of data, the expansion apparatus comprising:
   a. means for evaluating each section sequentially and determining if it contains incompressible data or a backwards pointer immediately following the identifier header;
   b. if incompressible data is found, then using means for copying data from the input stream according to the count value in the identifier header; and
   c. if a backwards pointer is found, then using means for copying data from the previously expanded data referred to by the backwards pointer according to the count value in the identifier header.

* * * * *